United States Patent [19]

Wood et al.

[11] 4,347,439
[45] Aug. 31, 1982

[54] LEVEL-SHIFT AND PULSE SHAPING CIRCUITRY

[75] Inventors: Stanley E. Wood, Inyokern; Kenneth L. Moore, China Lake, both of Calif.

[73] Assignee: The United States of America as represented by the Secretary of the Navy, Washington, D.C.

[21] Appl. No.: 8,644

[22] Filed: Feb. 1, 1979

Related U.S. Application Data

[63] Continuation of Ser. No. 811,742, Jun. 30, 1977, abandoned.

[51] Int. Cl.³ .................................................. G01V 9/04
[52] U.S. Cl. .................................. 250/222 R; 250/209
[58] Field of Search ........... 250/221, 222, 209, 214 R; 307/311; 324/178

[56] References Cited

U.S. PATENT DOCUMENTS

| | | | |
|---|---|---|---|
| 3,381,219 | 4/1968 | Dumbeck | 324/178 |
| 3,675,030 | 7/1972 | Tanenhaus | 250/209 |
| 3,727,069 | 4/1973 | Crittenden | 250/222 R |
| 3,792,354 | 2/1974 | Slaught et al. | 324/178 |

*Primary Examiner*—David C. Nelms
*Attorney, Agent, or Firm*—Robert F. Beers; W. Thom Skeer; Kenneth G. Pritchard

[57] ABSTRACT

A light detector with level shift and shaped pulse is obtained by circuitry which provides both short turn off time and high sensitivity. The phototransistor does not provide the reference signal until nearly at maximum output.

5 Claims, 5 Drawing Figures

LEVEL-SHIFT AND PULSE SHAPING CIRCUITRY

This is a continuation of application Ser. No. 811,742, filed June 30, 1977, now abandoned.

BACKGROUND OF THE INVENTION

1. Field of the Invention

This invention relates to the field of light detectors. In particular it relates to phototransistor light detectors with short turn off time and high sensitivity. A phototransistor light detector with the short turn off time and high sensitivity permits construction of light detectors capable of measuring rapid events.

2. Description of Prior Art

Light detection devices for measuring rapid events such as muzzle velocity projectiles are limited by their turn off time and sensitivity. There is usually an inverse trade off between the turn off time and sensitivity of phototransistors, even silicon phototransistors. In particular it has been difficult to provide shifts in voltage levels for phototransistors down to transistor-transistor logic (TTL). It is highly desirable to use phototransistors shifted down to TTL level because this is a common or standard logic level for most computers.

Previous methods to reach the TTL level have been resistor and capacitor networks. These methods are unreliable, cumbersome and time consuming as they require precise adjustment of variable resistors. An additional problem has been the high amount of false information which has resulted from attempting to take signals off near the initial part of the transition wave form and to reliably trigger pulses at levels close to the collector supply potential. Phototransistors alone do not give uniform response.

In summary, previous uses of phototransistors have been severally limited at low levels of light and the manufacturing tolerances which have given a factor of 2 in the variation of collector on-voltage. Thus there is a need for repeatable phototransistor turn-off points which are still sensitive to rapid events. The reason sensitivity and speed have a trade off is that increased sensitivity requires a larger active area which increases the capacitance and gives the circuit a longer time constant.

SUMMARY OF THE INVENTION

A level shifting inverter and pulse shaping circuit is provided by adjusting the detecting level output of the phototransistor to near maximum output. Passage of a projectile or other object over the phototransistor cuts off light maintaining the phototransistor at near maximum output. Through use of the appropriate resistors the triggering of a PNP transistor will occur in a region where phototransistor parameter variations are minimized. In addition to serving this function, the circuit provides a pulse level which upon passing through the inverter is reduced to a voltage level comparable to TTL levels.

Therefore an object of this invention is to provide a light detector which provides repeatability of performance out of variable devices and to also provide a light detector which is capable of giving phototransistor pulses which have been shifted down to levels compatable with TTL integrated circuits.

DESCRIPTION OF THE PREFERRED EMBODIMENT

Figure 1:
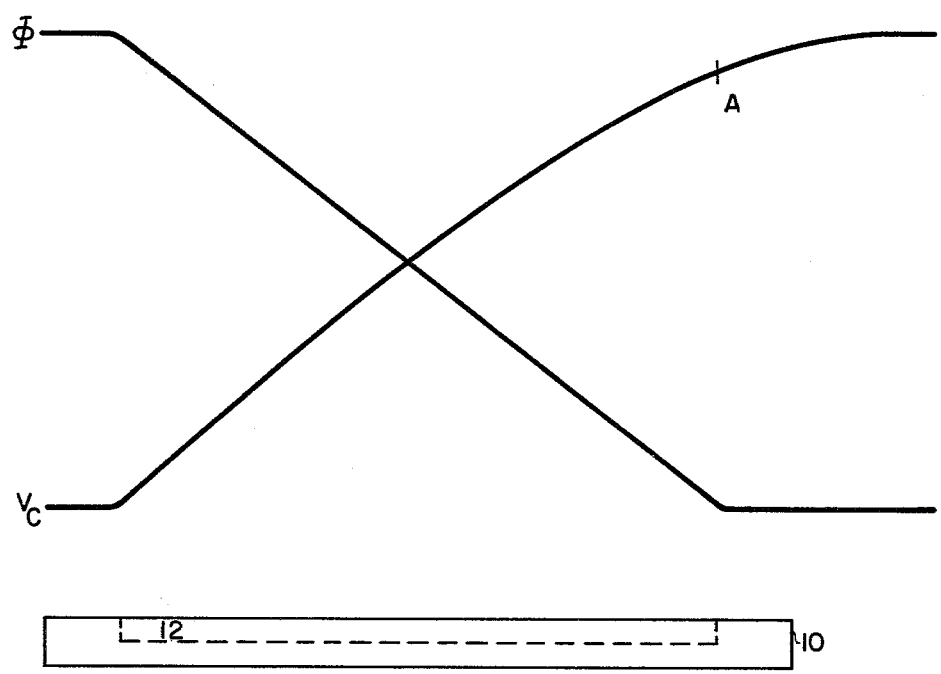
FIG. 1 is a graph of the incident light flux versus time and the corresponding phototransistor collector voltage.

In FIG. 1 it is shown that the flux incident on the active area of a given detector varies more or less linearly as a function of area obscuration with respect to the chip. For purposes of illustration, it will be assumed that the obscuration is provided by a projectile passing between the light source and a chip. The phototransistor 10 which is a silicon phototransistor, has an active area 12 of the phototransistor chip. The graph represents a projectile passing from left to right as it obscures active area 12 shown by the dashed line. When the collector voltage rises to level A, a pulse will be initiated by detector drops more or less linearly as a function of projectile position with respect to the chip. The collector potential rises as the photocurrent drops, reaching an upper limit of around ten volts shortly after the detector is totally obscured by the projectile.

Figure 2:
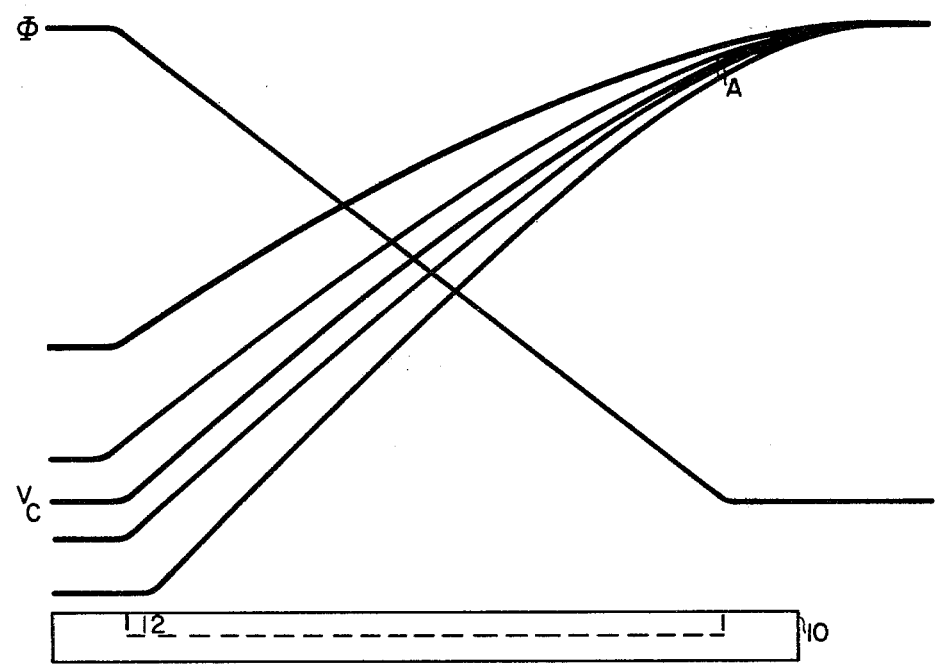
FIG. 2 is a graph similar to FIG. 1 except a typical family of phototransistor responses is shown.

In FIG. 2 the same elements as shown in FIG. 1 are repeated except that now several voltage response curves for different transistors are shown. The five lines shown represent a typical spread of voltage response from commonly manufactured phototransistors. By using a low voltage triggering level it can be seen that it is possible to pick a level where a transistor response is either way below or already above the desired monitoring voltage. By picking point A near the maximum output voltage, advantage can be taken of the fact that the transistor response curves all asymptotically reached the same limit. Thus in order to reduce the possibility of false information which might result from attempting to take signals off near the initial part of the transition wave form, it was decided to devise a method for reliably triggering secondary pulses at levels close to the collector supply potential. It should be noted that the phototransistors shown in FIGS. 1 and 2 are reacting to a shadow of the projectile cutting off incident light upon them.

Figure 3:
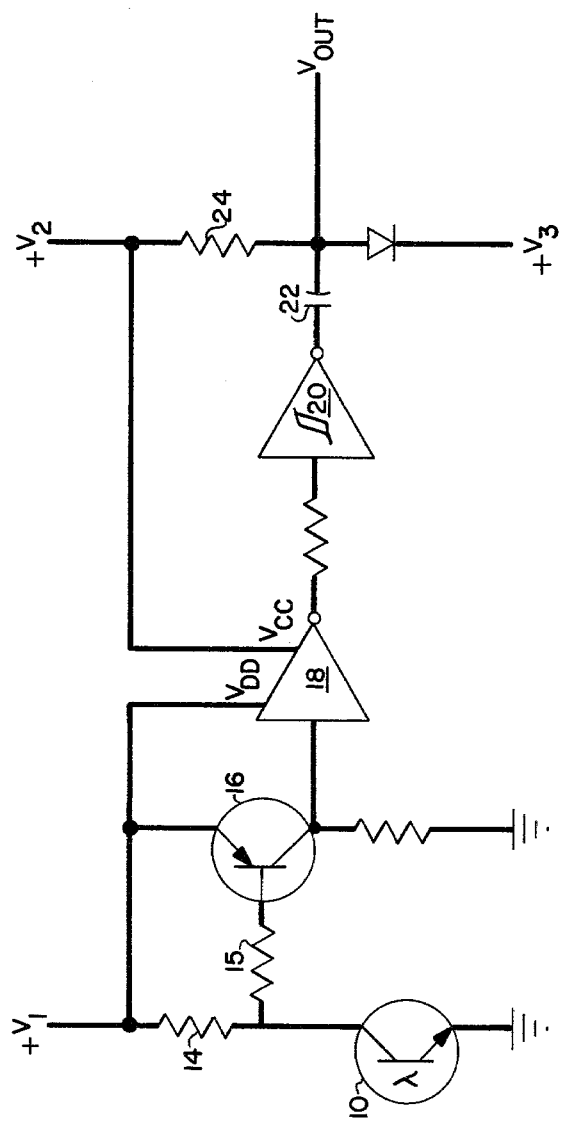
FIG. 3 is a circuit diagram of the preferred embodiment.

FIG. 3 is a circuit that was devised to facilitate having a trigger voltage level close to maximum output. Phototransistor 10 is connected between supply voltage $V_1$ and ground through a resistor 14. Resistors 14 and 15 are chosen on the basis that a low resistance in these locations permits a short turn off time but use of low resistance in these locations gives a large on-voltage variation. Thus resistors 14 and 15 are picked at values to produce optimum response in both areas. A PNP transistor 16 is wired common emitter and gives an abrupt transition when phototransistor 10 collector voltage reaches the level marked as point "A" in FIG. 1. This causes transistor 16 to cut off, with a subsequent drop in voltage at the input to a level shifter inverter 18. Inverter 18 can be a CMOS level shifting inverter such as a CD 4009. Inverter 18 is operated as a level shifter inverter by connecting the $V_{DD}$ terminal to a high voltage such as 10 volts and the $V_{CC}$ terminal to the 5 volt TTL supply. Its output is thus a logic level signal which is used to trigger a negative transition at the output of a Schmitt trigger inverter 20. Schmitt trigger inverter 20 in a resistor capacitor network, operating as a pulse forming circuit means, generates a logic level pulse. The duration of the logic level pulse is determined by the resistor capacitor network, consisting of a resistor 24 and a capacitor 22.

Figure 4:
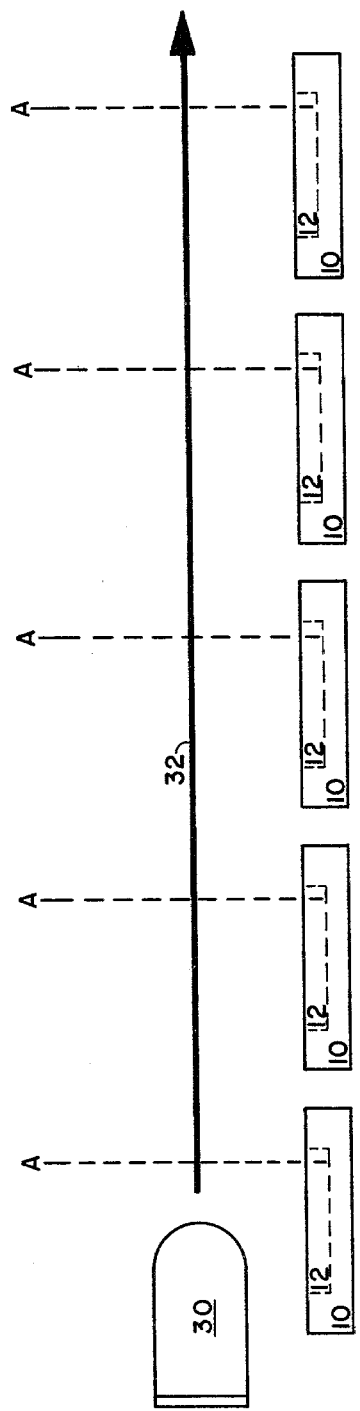
FIG. 4 is a diagram of a functional set-up of the preferred embodiment.

FIG. 4 shows a configuration where these phototransistor light detectors are placed in sequence along a given path. Again an example of such a path could be near the muzzle of a gun which then monitors the movement of the projectile across the line of phototransistors. By noting the signal time differences along the path, the muzzle velocity of such a gun could be determined. As shown in FIG. 4, a projectile 30 is traveling along a pre-determined path 32. Each location of phototransistor 10 with active region 12 has a level of obscuration which provides reference voltage "A". As can be seen in FIG. 4 there are equal spaces between the points or each phototransistor that correspond to voltage output "A". Thus the small amount of fluctuation left between transistors shown in FIG. 2 around voltage level "A" means that the actual variations in spacing between the points between phototransistors can be made as small as desired. Thus the timing pulses provide an accurate reference point of where the leading edge of projectile 30 is when each phototransistor 10 gives its reference pulse. Similarly, gun wear could be measured by monitoring the amount of recoil with this array.

Figure 5:
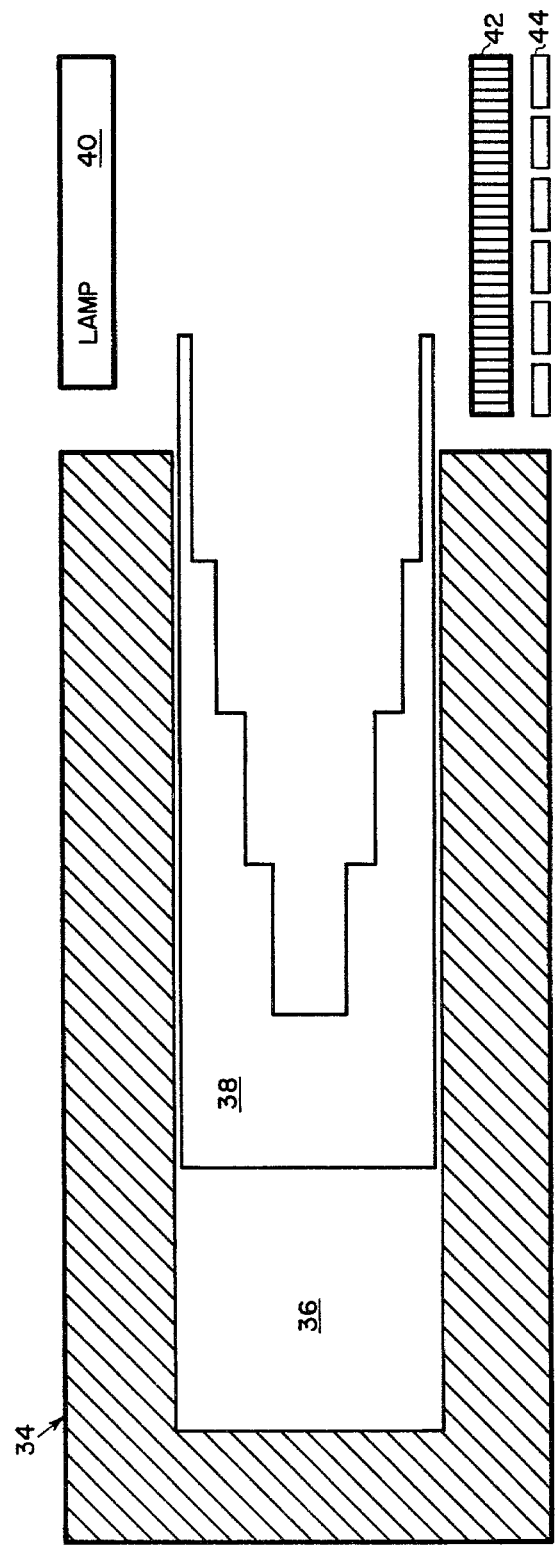
FIG. 5 is a cross-section diagram of the present invention being used to measure the shot start motion of a projectile.

A more important example is measuring the shot start motion of a projectile. In FIG. 5, a gun barrel 34 is shown in cross section. Within gun barrel 34 is a propellant 36 and a projectile with an aluminum extention 38. Projectile with an aluminum extension 38 protrudes from gun barrel 34. Across the muzzle is a lamp 40 which shines light through a collimator 42 onto a phototransistor array 44. Projectile with an aluminum extension 38 will cut off light from the very moment that propellant 36 first ignites. This provides information on the burning rate of propellant and engraving process of the projectile by the rifling.

From the above it is obvious that many more applications of such a phototransistor light detector are possible. Also obvious modifications of such phototransistor arrays can be made depending on the specific application.

What is claimed is:

1. A light detection device for measuring motion of an object comprising:
   a lamp for emitting light;
   a collimator with a plurality of slots spaced a predetermined distance from said lamp for transmitting light from a predetermined direction from said lamp such that passage of an object through said space between said lamp and collimator sequentially cuts off transmitted light through said slots of said collimator; and
   a plurality of level-shift and pulse shaping circuits with a phototransistor per circuit, said phototransistors connected to respond near their maximum output voltage thus permitting logic level, TTL level, connections placed on the opposite side of said slotted collimator from said lamp such that each phototransistor monitors the transmitted light from a predetermined group of slots in said collimator.

2. A light detection device for measuring motion of an object as described in claim 1 wherein said level-shift and pulse shaping circuits comprise:
   a voltage source;
   a phototransistor having a collector operatively connected to said voltage source for sensing an object upon said object passing between said phototransistor and said lamp;
   a PNP transistor, having an emitter connected to said voltage source, a base connected to said collector of said phototransistor and a collector;
   a level-shifting inverter, having an input connected to said collector of said PNP transistor and having an output for generating a logic level signal; and
   pulse forming circuit means, having an input connected to said output of said level-shifting inverter for producing a logic level pulse.

3. A level-shift and pulse shaping circuit as described in claim 2 wherein said pulse forming circuit means comprises:
   a Schmitt trigger inverter having an input connected to said output of said level-shifting inverter and having an output; and
   a resistor-capacitor network operatively connected to said output of said Schmitt trigger inverter.

4. A method of measuring the shot start motion of a projectile from a gun barrel comprising the steps of:
   shining a light of predetermined dimensions across the muzzle of a gun barrel;
   subdividing the light into parallel paths on the opposite side of the muzzle;
   illuminating a plurality of level-shift and pulse shaping circuits with said subdivided light by use of phototransistors which are connected to respond near their maximum output voltage thus permitting logic level, TTL level, connections such that a predetermined signal is emitted from each circuit when said projectile blocks light to that particular circuit; and
   comparing the time differences of said predetermined signal from said curcuits when a projectile is fired.

5. A method of measuring gun wear as a function of recoil action comprising the steps of:
   shining a light of predetermined dimensions across the area where said gun will recoil into;
   subdividing the light a predetermined distance from the source of the light with a collimator into a series of parallel light beams, said parallel beams formed after the light has crossed said recoil area, such that when said gun recoils it enters said predetermined distance and block light from entering said collimator; and
   illuminating a plurality of level-shift and pulse shaping circuits with said subdivided light by use of phototransistors which are connected to respond near their maximum output voltage thus permitting logic level, TTL level, connections such that a predetermined signal is emitted from each circuit when said gun blocks light to that particular circuit; and
   comparing the time differences of said predetermined signals from said circuits when said gun recoils.

* * * * *